United States Patent
Magera et al.

(10) Patent No.: US 7,427,562 B2
(45) Date of Patent: Sep. 23, 2008

(54) METHOD FOR FABRICATING CLOSED VIAS IN A PRINTED CIRCUIT BOARD

(75) Inventors: Jaroslaw A. Magera, Palatine, IL (US); Gregory J. Dunn, Arlington Heights, IL (US); Kathy D. Leganski, Elgin, IL (US)

(73) Assignee: Motorla, Inc., Schaumburg, IL (US)

( * ) Notice: Subject to any disclaimer, the term of this patent is extended or adjusted under 35 U.S.C. 154(b) by 129 days.

(21) Appl. No.: 11/557,690

(22) Filed: Nov. 8, 2006

(65) Prior Publication Data
US 2008/0119041 A1    May 22, 2008

(51) Int. Cl.
*H01L 21/4763* (2006.01)

(52) U.S. Cl. .............. 438/637; 257/E23.067

(58) Field of Classification Search ......... 438/637, 438/667; 257/668, E23.067, E23.174, E23.19
See application file for complete search history.

(56) References Cited

U.S. PATENT DOCUMENTS

| | | | |
|---|---|---|---|
| 5,263,243 A | 11/1993 | Taneda et al. | |
| 6,039,889 A | 3/2000 | Zhang | |
| 6,282,782 B1 | 9/2001 | Biunno et al. | |
| 6,841,080 B2 | 1/2005 | Kingon et al. | |
| 6,921,505 B2 | 7/2005 | Lee et al. | |
| 2003/0121700 A1 | 7/2003 | Schmidt | |
| 2003/0178388 A1 | 9/2003 | Phillips | |
| 2004/0108137 A1 | 6/2004 | Vetter et al. | |
| 2006/0121722 A1 | 6/2006 | Card | |
| 2006/0193105 A1* | 8/2006 | Sakata et al. | 361/528 |
| 2007/0139294 A1* | 6/2007 | Dunn et al. | 343/909 |
| 2007/0148829 A1* | 6/2007 | Yoshino et al. | 438/128 |

\* cited by examiner

Primary Examiner—Thao P. Le
(74) *Attorney, Agent, or Firm*—James Lamb; Valeria M. Davis

(57) ABSTRACT

A method for forming closed vias in a multilayer printed circuit board. A dielectric layer is laminated to one side of a central core having a metal layer on each side. A second dielectric layer is laminated to the other side of the central core. Closed vias in the central core have been formed by drilling partially through but not completely penetrating the central core, and then completing the via from the opposite side with a hole that is much smaller in diameter to form a pathway that penetrates completely through the central core from one side to another. The via is then plated with metal to substantially close the smaller hole. Approximately one half of the closed vias are situated such that the closed aperture faces one dielectric layer and a remainder of the closed vias are situated such that the closed aperture faces the other dielectric layer. Resin from one dielectric layer fills the cavities of approximately one half of the closed vias, and resin from the other dielectric layer fills the circular cavities of the remainder of the closed vias. The total amount of resin migrated from each of the dielectric layers into the closed via cavities is approximately equal.

16 Claims, 5 Drawing Sheets

US 7,427,562 B2

METHOD FOR FABRICATING CLOSED VIAS IN A PRINTED CIRCUIT BOARD

CROSS REFERENCE TO RELATED APPLICATION

This application is related to application Ser. No. 11/557,711 entitled "PRINTED CIRCUIT BOARD HAVING CLOSED VIAS", filed on even date herewith, and assigned to assignee hereof.

FIELD OF THE INVENTION

The present invention relates generally to printed circuit boards. More particularly, this invention relates to methods of forming blind vias in multilayer printed circuit boards.

BACKGROUND

The continual drive to create smaller, lighter, and thinner portable electronic devices, such as cellular telephones, requires that components, and especially the printed circuit board, must not limit the shape and size of these devices. The printed circuit board (PCB) must occupy minimal volume and accommodate the latest high density chip scale component packages. Multilayer PCBs route signals from one layer to another by means of vias, creating a compact, high density substrate. Currently, a designer does not have complete freedom to specify a layer X to layer Y connection, but is restricted to a few cost-effective via options such as mechanical and laser drilling, sequential lamination, and build up. Mechanically drilled vias can penetrate the entire PCB, but they occupy space on every layer. Laser drilled blind microvias can be employed to reduce the size and cost of the PCB, and, compared to mechanical drilling, laser drilling allows much smaller vias, and hence smaller via capture pads. Unfortunately, in a build-up construction, laser formed blind vias can only connect the outermost layer to the next inner layer. Additional size reduction could be achieved with solidly plated microvias, which allows for via stacking and fan-out for high density chip scale component packages. But solid vias require specialized plating techniques, and are only possible for vias less than 4 mils in diameter and in dielectrics less than 2 mils thick. Therefore, many board designs continue to use mechanical blind vias, foregoing the size reduction advantages of laser microvias.

Additionally, buried vias (the plated holes in the interior layers of a PCB) provide z-axis interconnection, and do not consume real estate on the outer layers of the PCB. Buried vias have often been combined with laser drilled microvias, but it is difficult to obtain equal and uniform dielectric thickness on either side of the central core when the outer layers are laminated to the core. This is because resin from the various layers does not fill the buried vias in a predictable, balanced, or uniform manner. Resin flow can vary so much that the resin thickness on the top and bottom layers can differ by as much as 2 mils, which is unacceptable for circuits that have critical impedance requirements. In addition, inconsistent resin flow can cause dimples and voids, which are also unacceptable.

It is therefore highly desirable to find a means of creating high density microvias in multi-layer PCBs for use in radio frequency (RF) applications and other circuits that have critical impedance requirements.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
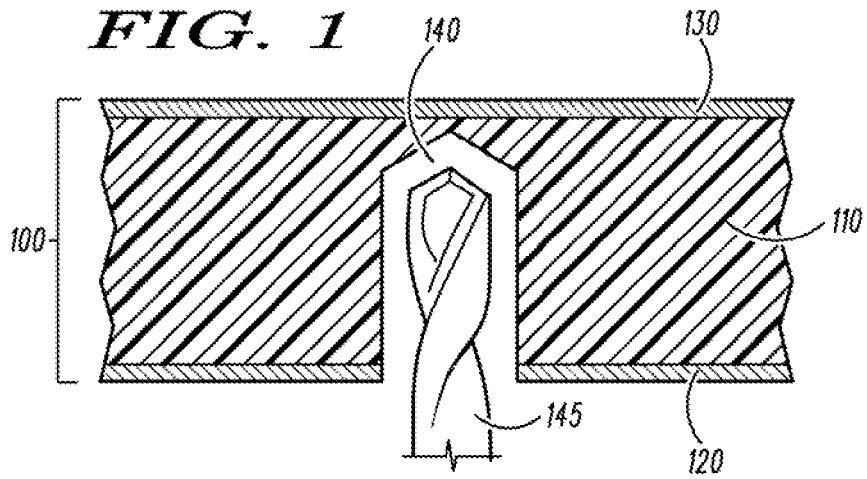
FIG. 1 is a cross-sectional view of a hole drilled partially through a printed circuit board in accordance with certain embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps or actions and apparatus components related to closed vias in a multilayer printed circuit board. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

It will be appreciated that embodiments of the invention described herein may be comprised of one or more conventional processes and/or materials. Of course, a combination of processes and/or materials could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of creating a high density multilayer printed circuit board with minimal experimentation.

A printed circuit board substrate comprises N layers of dielectric laminate and N+1 layers of metal, for example a single layer of dielectric laminate with a layer of metal on each side, or three layers of dielectric laminate with four layers of metal. An N-layer circuit board is fabricated by laminating a first metal foil and a first dielectric prepreg layer to a first side of an N−2 layer printed circuit board core having N−1 layers of metal, and simultaneously laminating a second metal foil and a second dielectric prepreg layer to a second side of the core. Prior to this lamination, closed vias in the central core are formed by drilling partially through but not completely penetrating the central core, and then completing the via from the opposite side with a hole that is much smaller in diameter to form a pathway that penetrates completely through the central core from one side to another. The via is then plated with copper to substantially close the smaller hole. Approximately one half of the closed vias are situated such that the closed aperture faces one dielectric prepreg layer and a remainder of the closed vias are situated such that the closed aperture faces the other dielectric prepreg layer. Resin from one dielectric prepreg layer fills the circular cavities of approximately one half of the closed vias, and resin from the other dielectric prepreg layer fills the cavities of the remainder of the closed vias. The total amount of resin migrated from each of the dielectric prepreg layers into the closed via cavities is approximately equal.

Figure 2:
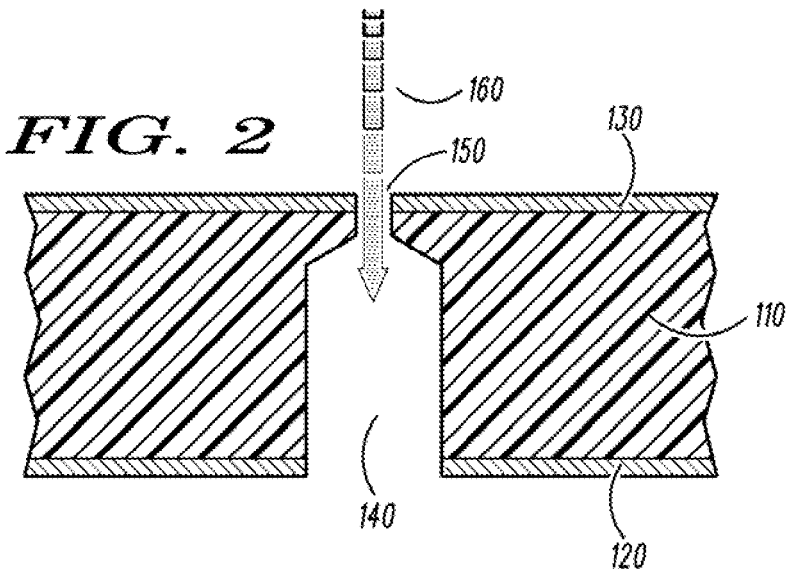
FIG. 2 is a cross-sectional view of the printed circuit board of FIG. 1, depicting a laser beam piercing completely through the remaining thickness portion of the printed circuit board to the partially drilled hole, in accordance with certain embodiments of the present invention.

Referring now to FIG. 1, a closed microvia is formed in a printed circuit board in a first embodiment by starting with a central core 100 comprising a dielectric laminate 110, typically a resin such as epoxy or polyimide that is reinforced with chopped or woven glass fibers. Laminated to each side of the dielectric laminate 110 is a thin layer of metal foil 120, 130 such as copper. While FIG. 1 illustrates the simplest case of a single dielectric laminate and two metal layers, more complex printed circuit cores are also possible, for example a core with three dielectric layers and four metal layers, or any combination of N dielectric layers and N+1 metal layers. An aperture 140 is formed in the PCB by mechanically drilling, with for example, a carbide drill 145, completely through the metal foil 120 on one side of the core 110 and partially into, but not completely through, the core 110. In an alternate embodiment, this blind hole can be formed with a laser. The drilling is carefully controlled so as to stop prior to piercing the metal foil 130 on the opposite side of the core 110. Ideally, the drilled hole would stop exactly at the inner surface of the second layer of metal foil 130, but in practice, this may not always be achievable, due to mechanical tolerances of the process equipment. The upper layer of metal foil 130 might be dimpled or partially pierced during the drilling, but any opening in the metal foil should be minimal. If the drilled hole stops short of the inner surface of the metal foil, then some dielectric material will remain at the bottom of the hole, and will be subsequently removed next. Referring now to FIG. 2, a laser beam 160 is impinged upon the side of the PCB opposite to the side that the hole was drilled from, to penetrate the metal foil and remove any dielectric material that may remain at the bottom of the partially drilled hole. The laser beam forms a hole 150 in the metal foil 130 that is substantially co-axial to the aperture 140, the diameter of the laser formed hole being less than 75%, and preferably less than 50%, of the diameter of the mechanically drilled hole. The large mechanically drilled hole 140 and the small laser formed hole 150 combine to create a complete pathway that penetrates through the printed circuit laminate from one side to another. Of course, one skilled in the art will realize that a plurality of these combined holes is formed in the typical PCB, at various locations as dictated by the PCB layout designer.

Figure 3:
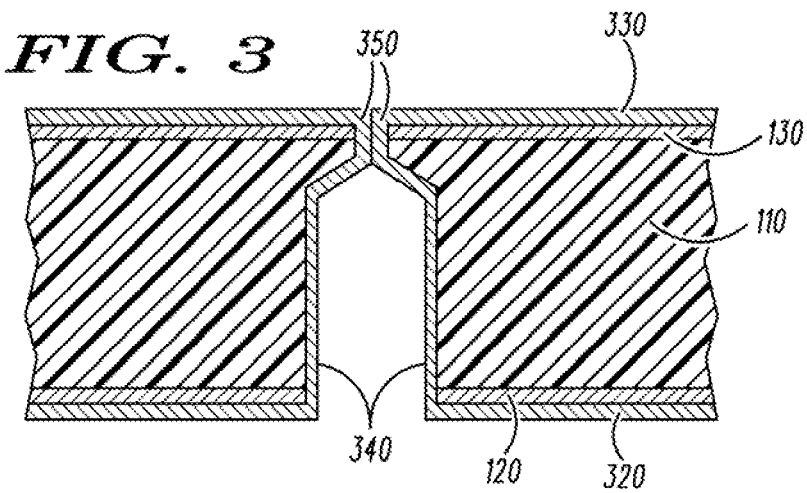
FIG. 3 is a cross-sectional view of the printed circuit board of FIG. 2, after metal is plated on the walls of the hole to close the laser pierced hole, in accordance with certain embodiments of the present invention.

Referring now to FIG. 3, after the through-via is formed in the laminate with two different sized openings, the laminate is then plated with metal plating, typically copper, in one or more of a number of conventional manners, such as electroless or electrolytic plating, for example, or a combination thereof. Copper 320, 330 is plated onto the surfaces of the metal foils 120, 130 on both sides of the laminate, and copper 340, 350 is also plated on the walls of the mechanically drilled aperture 140 and on the walls of the laser formed aperture 150, respectively. The diameter of the laser formed aperture 150 and the thickness of the plating 350, 330 are chosen such that the plating in the laser formed aperture substantially fills it to form a closed microvia. That is, as a general rule, the plating thickness should be approximately one half of the diameter of the laser formed hole. The intent is to close the small hole, and to plate the walls of the large hole, so that an electrically continuous path is created from one metal layer 120 on one side of the laminate to the other metal layer 130 on the other side of the laminate.

Figure 10:
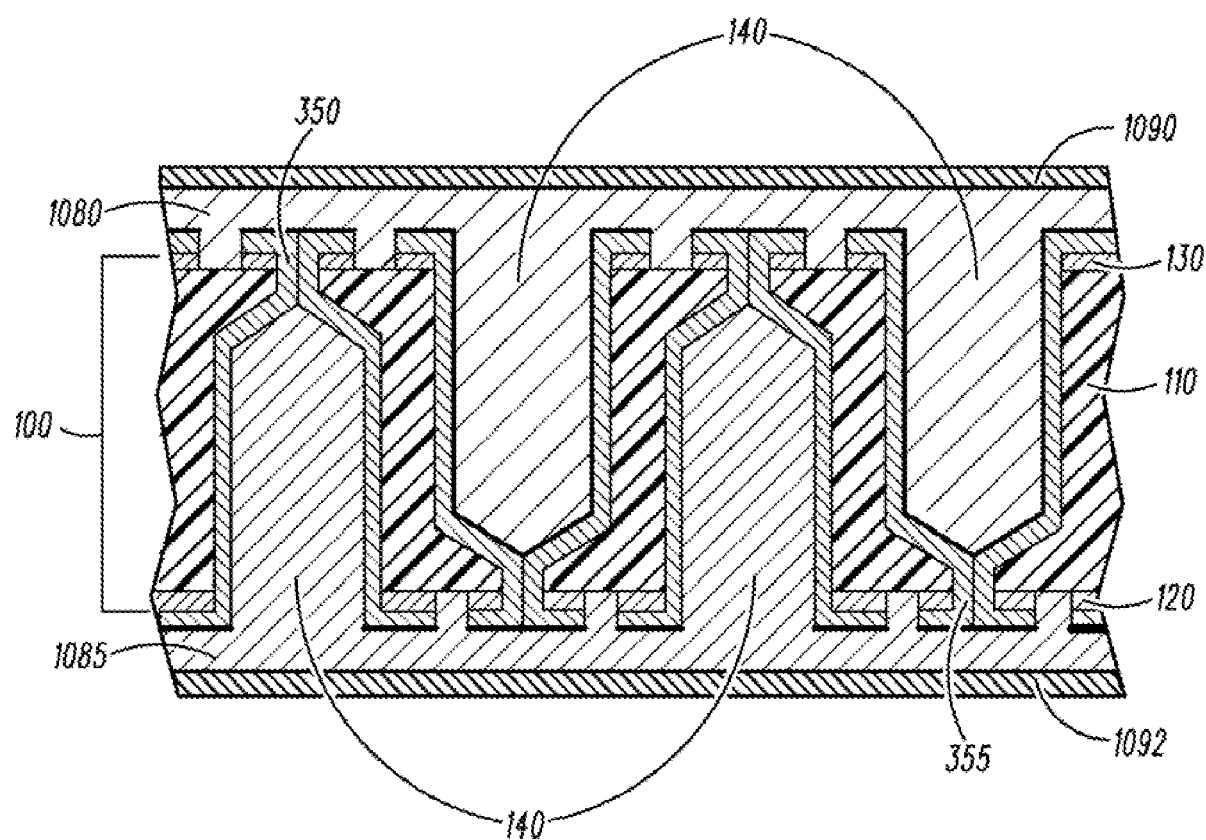
FIG. 10 is an example of a fully laminated printed circuit board, in accordance with some embodiments of the invention.

Having described a simple process for fabricating a closed microvia or "bottleneck via," (a plated-through-hole where one end is capped using a single plating step and a combination of mechanical controlled depth drilling and coaxial laser boring), we now describe a further embodiment depicted in FIG. 10. A first metal foil 1092 and a first dielectric prepreg layer 1085 are laminated to the metal foil 120 on one side of the laminate 100, and a second metal foil layer 1090 and a second dielectric prepreg layer 1080 are laminated to the metal foil 130 on the other side of the laminate. A plurality of the closed microvias comprising the two different sized coaxial apertures described above are distributed throughout the laminate such that approximately one half of the closed microvias are arranged to have the small, closed apertures 355 facing the first dielectric prepreg layer and a remainder of the closed vias are situated to have the small, closed apertures 350 facing the second dielectric prepreg layer. When the three layers are bonded together with heat and pressure, the resin 1085 from the first dielectric prepreg layer flows to fill the large cavities of the approximately one half of the closed vias, and resin 1080 from the second dielectric prepreg layer flows to fill the large cavities of the remainder of the plurality of closed vias, so that the total amount of resin that might migrate from each of the dielectric prepreg layers into the respective closed microvias is approximately equal. In this way, the resulting thicknesses of the two outer dielectric layers in their final, cured state are equal, or nearly so, because of the balanced flow of resin. Moreover, by judicious arrangement of the direction of the closed ends 350, 355 of the microvias, the resin flow in the multilayer PCB can be 'balanced' locally as well as globally so that no local cross sectional dimension is less than 90% of the maximum thickness of the multilayer PCB.

Figure 4:
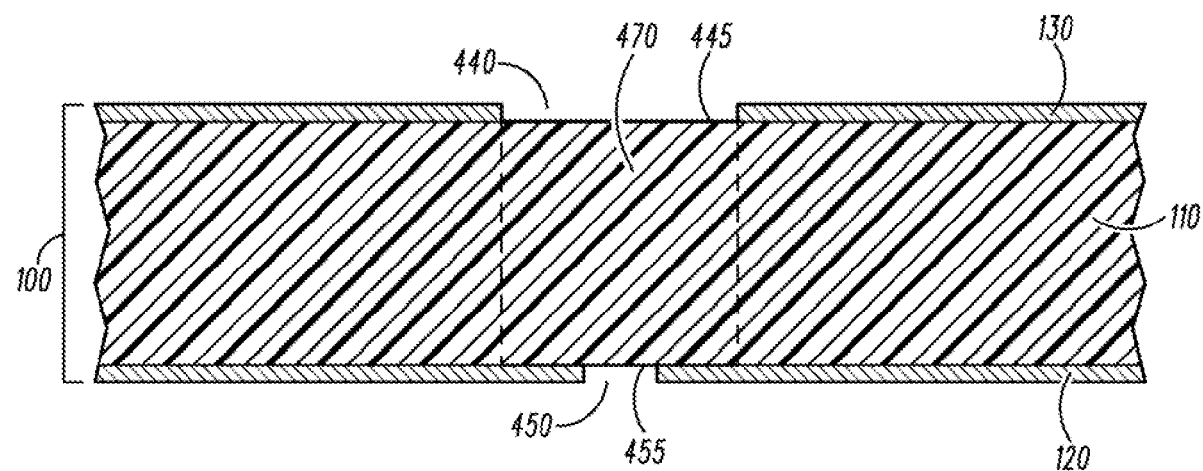
FIG. 4 is a cross-sectional view of a printed circuit board having metal foil selectively removed from two sides in accordance with certain embodiments of the present invention.
Figure 5:
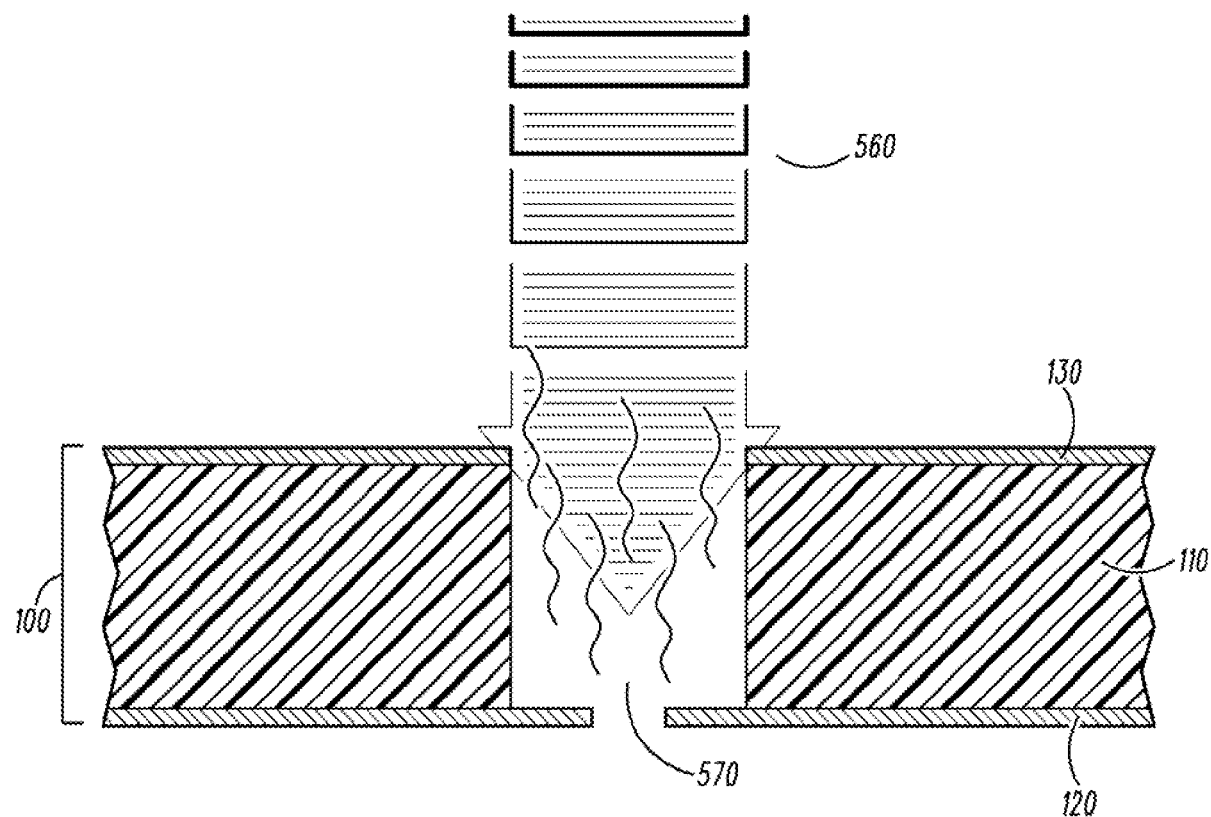
FIG. 5 is a cross-sectional view of the printed circuit board of FIG. 4, depicting a laser beam selectively removing dielectric material, in accordance with certain embodiments of the present invention.
Figure 9:
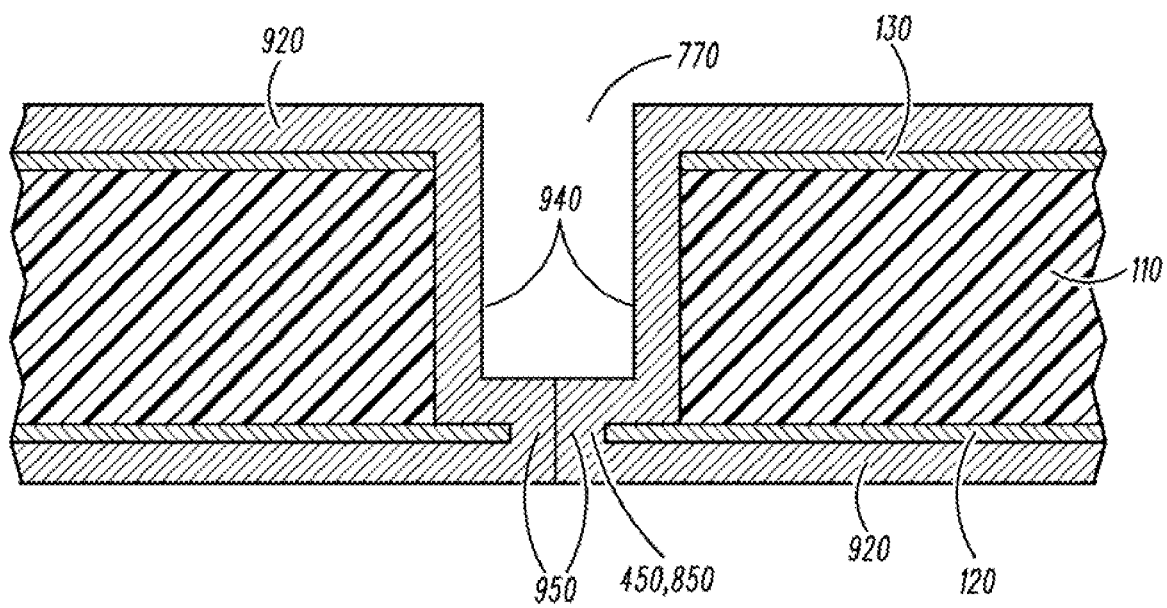
FIG. 9 is a cross-sectional view of the printed circuit board of either FIG. 5 or FIG. 8, after metal is plated on the walls of the hole to close the laser pierced metal foil, in accordance with certain embodiments of the present invention.

Referring now to FIG. 4, another embodiment of our invention forms a closed microvia by first selectively removing portions of metal to create substantially co-axial openings 450, 440 in metal foil layers 120, 130 that are clad onto an insulating dielectric core 110. The insulating dielectric core 110 is typically a resin such as epoxy or polyimide that is reinforced with chopped or woven glass fibers. Laminated to each side of the core 110 is a thin layer of metal foil 120, 130 such as copper. The co-axial openings 440, 450 are typically circular in shape, but may be other shapes, and are mutually substantially co-axial and substantially co-axial to a closed microvia to be formed subsequently in the following actions. Selectively removing the metal exposes the surface 445, 455 of the underlying dielectric, and is accomplished in conventional fashion, such as chemical etching, mechanical milling, or laser ablation. The two openings 440, 450 are situated so that one opening is substantially co-axial to the other opening, or as close as possible, given state-of-the-art tolerances. One opening 450 is substantially smaller than the other opening 440, with the diameter of the smaller opening being less than 50-75% of the diameter of the corresponding larger opening. As shown by the dashed lines in FIG. 4, a portion 470 of the dielectric that underlies the larger opening 440 will subsequently be removed next (FIG. 5). The metal foil 130 that remains on the surface of the dielectric core 110 acts as a mask for a laser ablation step. A laser beam 560 is impinged on the large opening 440 in order to ablate or vaporize away the dielectric material 470, leaving a void 570. The parameters of the laser beam are chosen so as to vaporize the dielectric material 470, but not to ablate or vaporize the copper foils 120, 130, as known to those of ordinary skill in the art. For example, a carbon dioxide laser is known to provide high selectivity in ablating polymer resins and woven glass with respect to copper foil. A passage has now been formed that penetrates completely through the dielectric core 100. Referring now to FIG. 9, the treated structure is then plated with metal, typically copper, in conventional fashion, such as electroless or electrolytic plating or a combination thereof, to coat the walls 940 of the via and the surfaces 920 of the metal foils 120, 130. The copper plating 950 in the small opening 450, 850 effectively closes the opening. The diameter of the smaller opening and the thickness of the plating are chosen such that the plating in the small opening substantially closes it to form a closed microvia. That is, as a general rule, the plating thickness should be approximately one half of the diameter of the small opening. The intent is to close the small hole, and to plate the walls of the large opening and the laser etched hole in the dielectric core, so that an electrically continuous path is created from one metal layer 120 on one side of the laminate to the other metal layer 130 on the other side of the laminate. As described previously, additional prepreg layers can now be laminated onto each side of the microvia-containing laminate to form a multilayer PCB. A plurality of these closed microvias can be distributed throughout the laminate such that approximately one half of the closed microvias are arranged to have the small, closed apertures 950 facing in one direction and a remainder of the closed vias can be situated to have the small, closed apertures facing in an opposite direction. By judiciously selecting the direction that the closed ends 950 of the microvias face, the resin flow in the multilayer PCB can be 'balanced' so that no local cross sectional dimension is less than 90% of the maximum thickness of the multilayer PCB. Moreover, the closed ends of the microvias permit additional microvias in the next layer of laminate to be "stacked" directly on top of these closed ends. The invention thus enables an "any layer via" multilayer board construction in which laser microvias are used for all vertical interconnect. Mechanically drilled vias and "staggered" microvias can both be eliminated, providing significant space savings.

Figure 6:
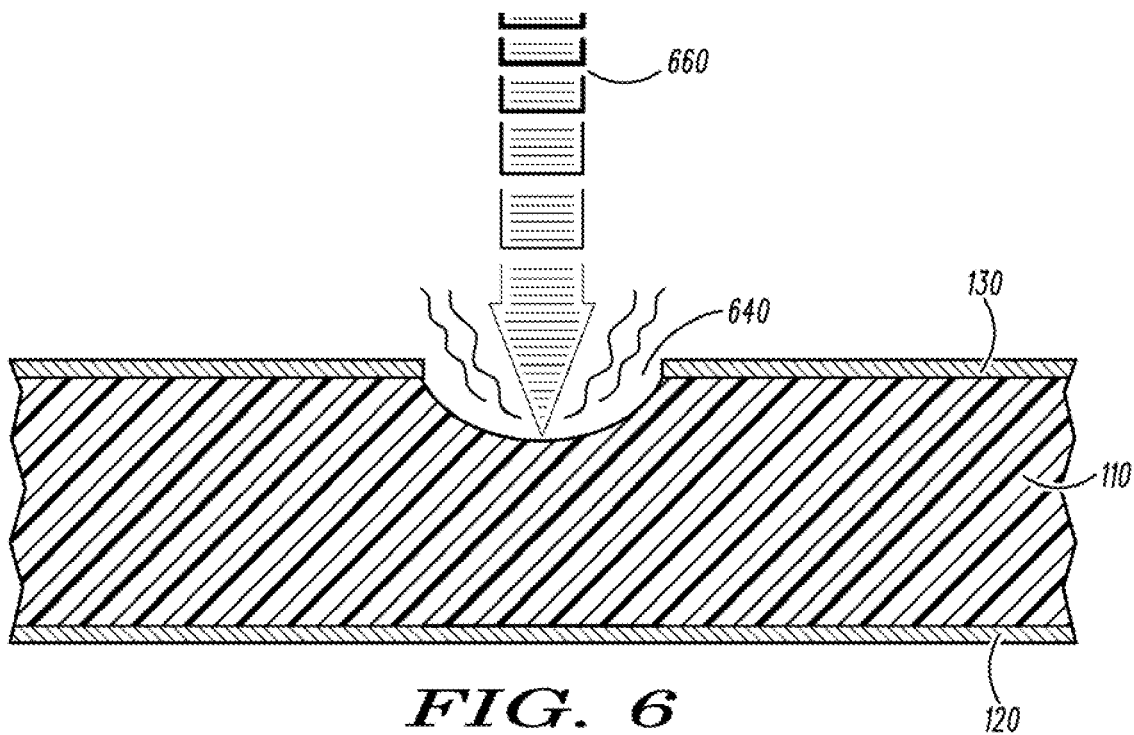
FIG. 6 is a cross-sectional view of a printed circuit board having metal foil and dielectric material selectively removed from one side in accordance with certain embodiments of the present invention.
Figure 7:
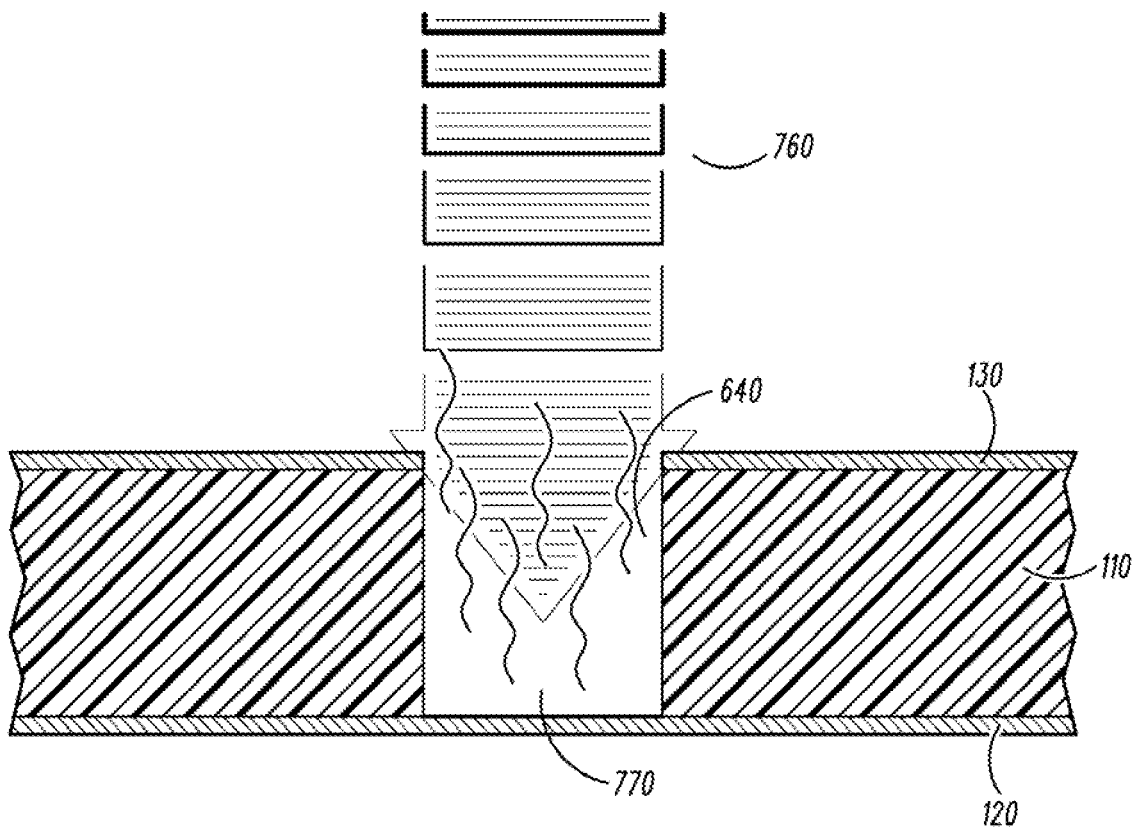
FIG. 7 is a cross-sectional view of the printed circuit board of FIG. 6, depicting a laser beam selectively removing dielectric material, in accordance with certain embodiments of the present invention.
Figure 8:
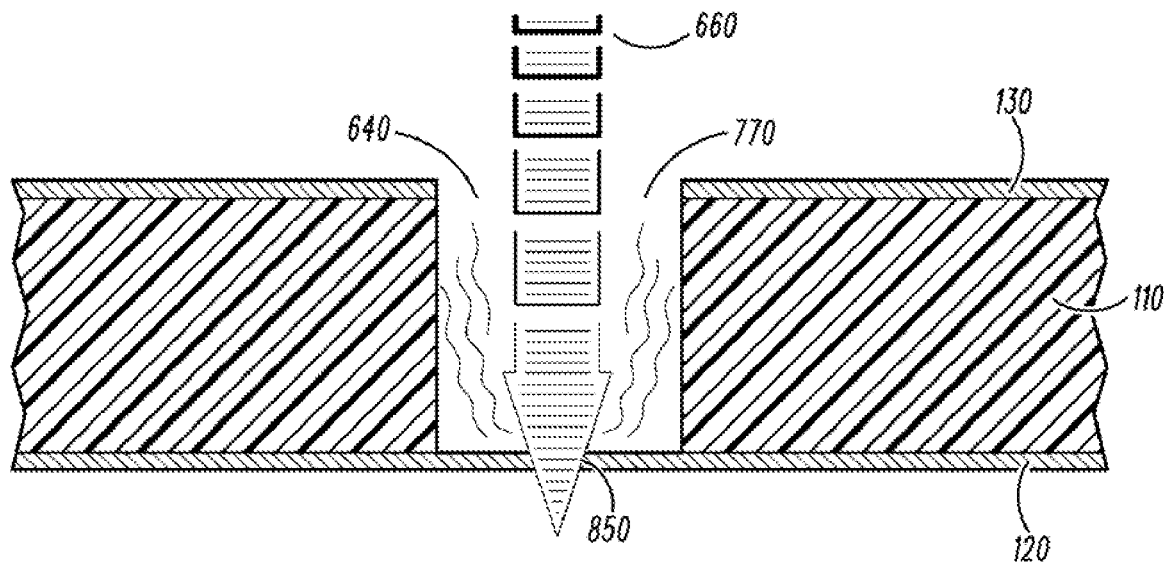
FIG. 8 is a cross-sectional view of the printed circuit board of FIG. 7, depicting a laser beam piercing through metal foil on one side, in accordance with certain embodiments of the present invention.

Referring now to FIG. 6, still another embodiment of our invention forms a closed microvia by first selectively removing portions of metal in conventional fashion, such as chemical etching, mechanical milling, carbon dioxide laser ablation, or ultraviolet laser ablation 660 to create an opening 640 in only one metal foil layer 130 that is clad onto an insulating dielectric laminate 110. The opening 640 is typically circular in shape, but may be other shapes, and corresponds to a location of a closed microvia to be formed in subsequent actions. While it is desirable to remove solely metal, sometimes a small portion of the underlying dielectric is removed, and this is acceptable. The metal foil 130 that remains on the surface of the dielectric laminate 110 acts as a mask for a second laser ablation step (FIG. 7). A laser beam 760 is impinged on the large opening 640 in order to ablate or vaporize away the dielectric material, leaving a void 770. The parameters of the laser beam are chosen so as to vaporize the portions of the dielectric material 110, but not to etch or vaporize either the copper foil 130 on the upper side or the metal foil 120 on the lower side of the laminate. At this point, a blind hole 770 has been formed that penetrates through the upper layer of metal foil 130 and the dielectric material 110 in the core, but not through the lower layer of metal foil 120. Referring now to FIG. 8, a carbon dioxide or ultraviolet laser beam 660 is impinged in the hole 770 to form an opening 850 in the lower layer of copper foil 120. This can also be performed by impinging the laser beam on the opposite side of the PCB. The two openings 640, 850 are situated so that one opening is substantially co-axial to the other opening and to a central axis of the void 770 in the dielectric layer, or as close as possible, given state-of-the-art tolerances. The opening 850 in the lower layer of foil 120 is substantially smaller than the opening 640 in the upper layer of foil 130, with the diameter of the smaller opening being less than 50-75% of the diameter of the corresponding larger opening. A passage has now been formed that penetrates completely through the structure. Referring now to FIG. 9, the treated structure is then plated with metal, typically copper, in conventional fashion, such as electroless or electrolytic plating or a combination thereof, to coat the walls 940 of the opening 770 in the dielectric and the surfaces 920 of the metal foils 120, 130. The copper plating 950 in the small opening 850 effectively closes the opening. The diameter of the smaller opening and the thickness of the plating are chosen such that the plating in the small opening substantially closes it to form a closed microvia. That is, as a general rule, the plating thickness should be approximately one half of the diameter of the small opening. The intent is to close the small hole, and to plate the walls of the large opening in the metal foil and the laser ablated hole in the dielectric core, so that an electrically continuous path is created from one metal layer 120 on one side of the laminate to the other metal layer 130 on the other side of the laminate. As described previously, additional prepreg layers can now be laminated onto each side of the microvia-containing laminate to form a multilayer PCB. A plurality of these closed microvias can be distributed throughout the laminate such that approximately one half of the closed microvias are arranged to have the small, closed apertures 950 facing in one direction and a remainder of the closed vias are arranged to have the small, closed apertures facing in an opposite direction. By judiciously selecting the direction that the closed ends 950 of the microvias face, the resin flow in the multilayer PCB can be 'balanced' so that no local cross sectional dimension is less than 90% of the maximum thickness of the multilayer PCB.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as critical, required, or essential features or elements of any or all the claims. The invention is defined solely by the appended claims including any amendments made during the pendency of this application and all equivalents of those claims as issued.

What is claimed is:

1. A method of manufacturing a closed via in a printed circuit board, comprising:
   providing a printed circuit laminate having metal foil on both sides;
   providing a first opening in the metal foil on one side of the printed circuit laminate;
   providing a second opening in the metal foil on the opposing side of the laminate substantially co-axial to the first opening, a diameter of the second opening being less than 75% of a diameter of the first opening;
   removing dielectric material in the portion of the printed circuit laminate exposed by the first opening to form a pathway completely through the laminate from one side to another; and
   providing metal plating on walls of the pathway and in the second opening at a thickness sufficient to substantially close the second opening to form a closed via.

2. The method as described in claim 1, wherein a plurality of closed vias are formed in the printed circuit board.

3. The method as described in claim 2, wherein the plurality of closed vias is arranged such that the closed second opening of approximately one half of the plurality of closed vias faces one side of the printed circuit laminate and the closed second opening of a remainder of the plurality of closed vias faces the opposite direction.

4. The method as described in claim 2, wherein the arranged plurality of closed vias is balanced so that no local cross sectional dimension of the printed circuit board is less than 90% of the maximum thickness of the printed circuit board.

5. The method as described in claim 1, wherein the first and second openings are formed by pattern etching.

6. The method as described in claim 1, wherein the dielectric material is removed by laser ablation.

7. A method of manufacturing a closed via in a printed circuit board, comprising:
   providing a printed circuit laminate having metal foil on both sides;
   providing a first opening in the metal foil on a first side of the printed circuit laminate;
   removing dielectric material in the portion of the printed circuit laminate exposed by the first opening to expose an inner surface of the metal foil on a second side of the printed circuit laminate;
   providing a second opening in the metal foil on the second side of the laminate substantially co-axial to the first opening, a diameter of the second opening being less than 75% of a diameter of the first opening so as to form a pathway completely though the laminate from one side to another; and
   providing metal plating on walls of the pathway and in the second opening of a thickness sufficient to substantially close the second opening on the second side of the laminate to form a closed via.

8. The method as described in claim 7. wherein a plurality of closed vias are formed in the printed circuit board.

9. The method as described in claim 8, wherein the plurality of closed vias are arranged such that the closed second opening of approximately one half of the plurality of closed vias faces one side of a printed circuit laminate and the closed second opening of a remainder of the plurality of closed vias faces the opposite direction.

10. The method as described in claim 9, wherein the arranged plurality of closed vies is balanced so that no local cross sectional dimension of the printed circuit board is less than 90% of the maximum thickness of the printed circuit board.

11. The method as described in claim 7, wherein the first and second openings are formed by an ultraviolet laser or by a carbon dioxide laser.

12. The method as described in claim 7, wherein the dielectric material is removed by laser ablation.

13. A method of manufacturing a closed via in a printed circuit board, comprising:
   providing a printed circuit core comprising one or more layers of dielectric laminate interleaved with two or more layers of metal foil;
   drilling partially through the printed circuit core to form a cavity that does not penetrate the metal foil on an opposing side of the printed circuit laminate;
   providing an opening on the opposing side of the laminate substantially coaxial to the cavity, a diameter of the opening being less than 75% of a diameter of the cavity so as to form a pathway completely through the laminate from one side to another; and
   providing metal plating on walls of the pathway of a thickness sufficient to substantially close the opening on the opposing side of the laminate to form a closed via.

14. The method as described in claim 13, wherein a plurality of closed vias are formed in the printed circuit board.

15. The method as described in claim 14, wherein the plurality of closed vias are arranged such that the closed opening of approximately one half of the plurality of closed vias faces one side of a printed circuit laminate and the closed opening of the remainder of the plurality of closed vias faces the opposite side.

16. The method as described in claim 15, wherein the arranged plurality of closed vias is balanced so that no local cross sectional dimension of the printed circuit board is less than 90% of the maximum thickness of the printed circuit board.

* * * * *